United States Patent [19]
Yamashita

[11] Patent Number: 5,841,173
[45] Date of Patent: Nov. 24, 1998

[54] MOS SEMICONDUCTOR DEVICE WITH EXCELLENT DRAIN CURRENT

[75] Inventor: Kyoji Yamashita, Osaka, Japan

[73] Assignee: Matsushita Electric Industrial Co., Ltd., Osaka, Japan

[21] Appl. No.: 664,957

[22] Filed: Jun. 13, 1996

[30] Foreign Application Priority Data

Jun. 16, 1995 [JP] Japan ................................. 7-150112

[51] Int. Cl.$^6$ ........................... H01L 29/76; H01L 29/94; H01L 31/062; H01L 31/113
[52] U.S. Cl. ........................ 257/384; 257/344; 257/345
[58] Field of Search ................................... 257/344, 335, 257/336, 382–384, 740, 773, 775, 345; 437/29, 34, 40

[56] References Cited

U.S. PATENT DOCUMENTS

| | | | |
|---|---|---|---|
| 4,821,085 | 4/1989 | Haken et al. | 257/384 |
| 5,068,696 | 11/1991 | Yang et al. | 257/384 |
| 5,091,763 | 2/1992 | Sanchez | 257/344 |
| 5,113,234 | 5/1992 | Furuta et al. | 257/384 |
| 5,341,028 | 8/1994 | Yamaguchi et al. | 257/344 |
| 5,635,746 | 6/1997 | Kimura et al. | 257/382 |

OTHER PUBLICATIONS

T. Yoshitomi et al., "Silicided Silicon–Sidewall Source and Drain (S$^4$D) Structure for High–Performance 75–nm Gate Length pMOSFETs", 1995 *Symposium on VLSI Technology Digest of Technical Papers*, pp. 11–12 (1995).

T. Shibata, et al., "An Optimally Designed Process for Submicrometer MOSFET's", *IEEE Transactions on Electron Devices*, vol. ED–29, No. 4, pp. 531–535 (1982).

*Primary Examiner*—Stephen Meier
*Attorney, Agent, or Firm*—Ratner & Prestia

[57] ABSTRACT

A MOS semiconductor device includes a first conductivity type silicon layer having a main surface; a gate insulating film selectively formed on the main surface of the silicon layer; a gate electrode provided on the gate insulating film; an insulating side wall formed on the side of the gate electrode; and source/drain regions formed in the silicon layer. The source/drain regions include a first diffusion layer of second conductivity type formed in the silicon layer; a second diffusion layer of second conductivity type formed in the silicon layer on the outside of the first diffusion layer and having a PN-junction depth larger than that of the first diffusion layer; and the MOS semiconductor device further includes a conductive layer covering at least part of the first diffusion layer and at least part of the second diffusion layer.

5 Claims, 6 Drawing Sheets

MOS SEMICONDUCTOR DEVICE WITH EXCELLENT DRAIN CURRENT

BACKGROUND OF THE INVENTION

1. Field of the Invention

The present invention relates to a MOS semiconductor device and a production method thereof. More particularly, it relates to a MOS semiconductor device which has low power consumption, is capable of high speed operation and has a structure suitable for achieving high packing density, and to a production method thereof.

2. Description of the Related Art

Miniaturization of a MOS semiconductor device is important in improving the packing density of a very large scale integrated circuit (VLSI).

Associated with this miniaturization are the following two problems.

(1) Due to an increase in parasitic resistance and parasitic capacitance, an improvement of circuit characteristics which conforms to scaling rules is becoming less and less probable. More specifically, the following phenomena are becoming a problem:
   a) an increase in the RC delay effect of the gate electrode due to a decrease in the gate length and a thinning of the gate insulating film;
   b) an increase in the drain PN-junction capacitance per unit area due to an increase in the substrate concentration (Vt control, punch through stopper, channel stopper).

(2) The gate electrode is designed so as to have the minimum size in accordance with the scaling rules. However, contacts between the source/drain diffusion layers and a first-level aluminum interconnection layer require a considerable amount of process margin with respect to the gate electrode and the device isolation region, respectively. For this reason, even if the size of the gate electrode is reduced in accordance with the scaling rules, the area of the source/drain diffusion layers itself cannot be reduced as expected. As a result, the area of the transistor as a whole becomes larger than that determined by the scaling rules, thereby preventing the high packing density from being realized. Furthermore, an increase in the area of the source/drain diffusion layers prompts an increase in the PN-junction capacitance as illustrated in the above (1) b).

In order to solve the above two problems, a salicide process has been proposed (for example, IEEE trans. on ED, ED-29, 1982, pp531–535).

Figure 7:
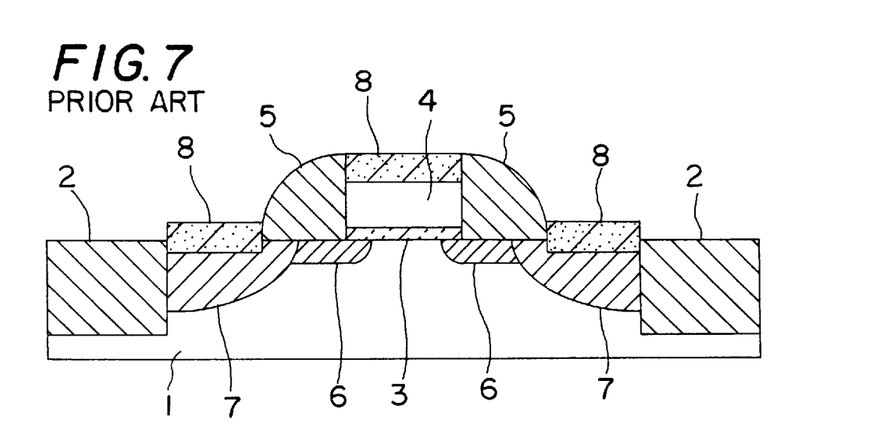
FIG. 7 is a cross-sectional view illustrating a MOS semiconductor of the prior art.

FIG. 7 is a cross-sectional view of a prior art salicide transistor produced by employing a conventional salicide process. In the figure, the transistor includes a P-type semiconductor substrate 1, isolating trenches 2, a gate insulating film 3, a gate electrode 4, $SiO_2$ side walls 5, shallow N-type diffusion layers 6, deep N-type diffusion layers 7 and silicide layers 8.

According to a CMOS process whose design rule is, for example, 0.5 μm, the silicidization reduces the sheet resistance from 40Ω/□ to 2Ω/□ for the gate electrode and from 100Ω/□ to 2Ω/□ for the source/drain diffusion layers. Since resistance of the gate electrode becomes small, the RC delay component of the gate electrode becomes considerably small. A simple estimate on this effect gives, for example, that the RC delay is reduced from about 8.5 ps to about 0.4 ps when the gate width is 10 μm. Here, principal parameters for the device are as follows. The gate length is 0.5 μm and the gate oxide film thickness is 10 μnm. The PN-junction depths of the shallow source/drain diffusion layers and the deep source/drain diffusion layers are about 150 μnm and about 200 nm, respectively. The impurity concentrations at the surfaces thereof are $6.0 \times 10^{18}$ $cm^{-3}$ and $2.0 \times 10^{20}$ $cm^{-3}$, respectively. The width of the side walls is about 150 nm and the Ti layer thickness for the silicide layers is 40 nm. The final thickness of the silicide layers to be formed is 80 nm.

The term "PN-junction depth" used in this specif- ication is defined to be a distance from the Si substrate surface to a location where the impurity concentration becomes $1.0 \times 10^7$ $cm^{-3}$.

Figure 8A:
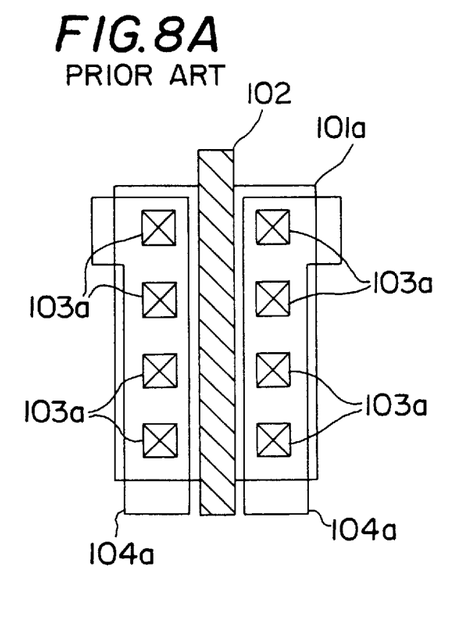
FIGS. 8A and 8B are plan views of MOS semiconductor devices of the prior art, FIG. 8A illustrating the device which did not use salicide processes and FIG. 8B illustrating the device which did use salicide processes.
Figure 8B:
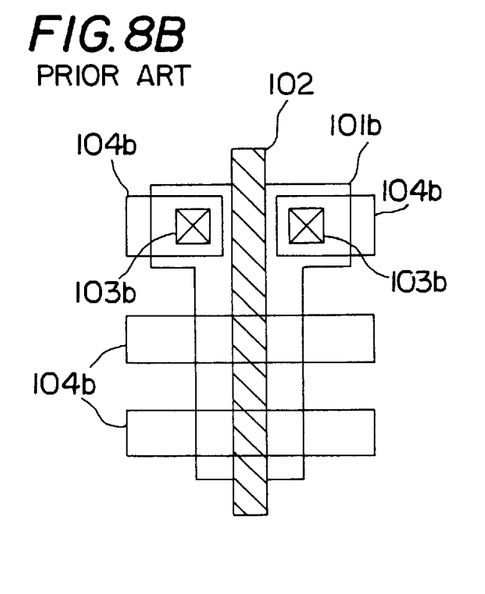

The main feature of the salicide process is that a layout such as the one shown in FIG. 8B can be employed. In FIGS. 8A and 8B, reference numerals 101a and 101b indicate regions where the source/drain diffu- sion layers are formed (active region), reference numeral 102 indicates a region where a gate electrode is formed, reference numerals 103a and 103b indicate contact regions by the source/drain diffusion layers and the first-level aluminum interconnection layer, and reference numerals 104a and 104b indicate regions where the first-level aluminum interconnections are formed. Since the formation of the silicide layers considerably reduces resistance in the source/drain regions, the number of the contact regions to be provided in each of the source/drain regions can be reduced to one. As described above, since the area of the source/drain regions can be reduced, higher integration can be achieved and drain PN-junction capacitance can be reduced. If the width of a narrow active region in the above-mentioned configuration (a distance from the edge of the active region stretched along the channel length direction to the edge of the gate electrode) is 0.75 μm, then the width of the silicide layers (a distance from the edge of the active region stretched along the channel length direction to the edge of the side wall) becomes 0.6 μm. For this reason, if the width of the gate electrode is 10 μm, then the resistance in the source/drain regions in the gate width direction becomes about 30Ω. On the other hand, since the channel resistance of the transistor is about 1 kΩ, the resistance in the source/drain regions is sufficiently small with respect to the channel resistance.

In a configuration illustrated in FIG. 8A where no silicidization is performed, the layout of the first-level aluminum interconnections is restricted in a certain way. However, in a configuration illustrated in FIG. 8B where the silicidization is performed, the degree of freedom in designing the layout of the first-level aluminum interconnections layer is improved.

However, the prior art configuration is not suited to a MOS semiconductor device whose size belongs to a deep submicron region. For example, according to a CMOS process where the design rule is 0.13 μm, the width of the silicide layers disposed on the source/drain regions is designed to be about 0.08 μm. The reason is that, although the width of the source/drain regions is reduced to about 0.2 μm, the width of the side walls can only be scaled to about 120 nm because of a need to inhibit a short channel effect. An example of this is that the PN-junction depth of the shallow source/drain diffusion layers becomes about 80 nm and the impurity concentration at the surface becomes $1.0 \times 10^{20}$ $cm^{-3}$. And, the PN-junction depth of the deep source/drain diffusion layers becomes about 120 nm and the impurity concentration at the surface becomes $2.0 \times 10^{20}$ $cm^{-3}$. The thickness of Ti to be deposited for the silicidization is designed to be about 30 nm and the final thickness of the silicide layers becomes 60 nm. The sheet resistance of the source/drain diffusion layers is maintained at 3Ω/□, which is almost the same as in the case of the CMOS process where the design rule is 0.5 μm.

If the gate width becomes 2.6 μm, then the resistance of the source/drain diffusion layers becomes about 98Ω in contrast to the channel resistance of the transistor being about 1 Ωk. In the layout illustrated in FIG. 8B, the drain current is reduced by 10%.

The present invention solves the above-mentioned problems, and its objective is to provide a MOS semiconductor device and a production method thereof, in which the drain current does not decrease when the salicide process is used in a deep submicron region or smaller.

SUMMARY OF THE INVENTION

According to one aspect of the present invention, a MOS semiconductor device includes a first conductivity type silicon layer having a main surface; a gate insulating film selectively formed on the main surface of the silicon layer; a gate electrode provided on the gate insulating film; an insulating side wall formed on the side of the gate electrode; and source/drain regions formed in the silicon layer. The source/drain regions include a first diffusion layer of second conductivity type formed in the silicon layer; a second diffusion layer of second conductivity type formed in the silicon layer on the outside of the first diffusion layer and having a PN-junction depth larger than that of the first diffusion layer; and the MOS semiconductor device further includes a conductive layer covering at least part of the first diffusion layer and at least part of the second diffusion layer.

In one embodiment of the present invention, the conductive layer includes a first part having a first thickness and a second part having a second thickness larger than the first thickness, and the first part of the conductive layer covers at least the part of the second diffusion layer.

In one embodiment of the present invention, the conductive layer is formed of silicide.

In one embodiment of the present invention, the gate electrode has a multi-layer structure including a lower silicon film and an upper silicide film.

In one embodiment of the present invention, the silicon layer is formed of a single-crystalline semiconductor.

In one embodiment of the present invention, the silicon layer is formed on a substrate having an insulating surface.

According to another aspect of the present invention, a method of producing a MOS semiconductor device includes the steps of forming a gate insulating film on a silicon layer; forming a gate electrode on the gate insulating film; forming a first diffusion layer of second conductivity type in the silicon layer; forming a spacer on the side of the gate electrode; and forming a second diffusion layer of second conductivity type in the silicon layer and on the outside of the first diffusion layer, the second diffusion layer having a PN-junction depth larger than that of the first diffusion layer. The method further includes the steps of depositing a first conductive layer to become a first silicide layer covering at least part of the first diffusion layer before the step of forming the spacer; and depositing a second conductive layer to become a second silicide layer covering at least part of the second diffusion layer after the step of forming the spacer.

In one embodiment of the present invention, the second conductive layer is deposited such that the second conductive layer is thicker than the first conductive layer.

In one embodiment of the present invention, at least one of the first conductive layer and the second conductive layer is formed of a refractory metal; and the first and second silicide layers are formed by reacting the refractory metal with part of the silicon layer.

In one embodiment of the present invention, at least one of the first conductive layer and the second conductive layer is formed of a refractory metal silicide layer.

According to still another aspect of the present invention, a method of producing a MOS semiconductor device includes the steps of forming a device isolation region on a main surface of a first conductivity type semiconductor substrate; forming a gate insulating film on the semiconductor substrate; depositing a first conductive film on the gate insulating film; patterning a photoresist so that the photoresist is at a prescribed location on the first conductive film where a gate electrode is to be formed; selectively etching a multi-layer film including the gate insulating film and the first conductive film with the photoresist being used as a mask by anisotropic etching having high anisotropy in the vertical direction until the gate insulating film is exposed; removing the photoresist; depositing a first insulating film on the substrate and the gate electrode; removing part of the first insulating film by anisotropic etching having high anisotropy in the vertical direction so that the remaining part thereof is on the side of the gate electrode; forming a first diffusion layer of second conductivity type in source/drain regions in the substrate by ion implantation; successively depositing a second conductive film and a second insulating film on the substrate and the gate electrode; selectively etching part of the second conductive film and part of the second insulating film so that the remaining part of the second conductive film has an L-shape and is on the side of the gate electrode and the remaining part of the second insulating film is on the outside of the second conductive film; forming a second diffusion layer of second conductivity type in the source/drain regions in the substrate by ion implantation, the second diffusion layer having a PN-junction depth larger than that of the first diffusion layer of second conductivity type; depositing a third conductive film on the substrate and the gate electrode, made of a film of the same kind as the second conductive film and having a thickness larger than that of the second conductive film; silicidizing the gate electrode and the source/drain regions in the substrate; and successively removing part of the third conductive film not silicidized, the second insulating film and part of the second conductive film not silicidized.

According to still another aspect of the present invention, a method of producing a MOS semiconductor device includes the steps of: forming a device isolation region on a main surface of a first conductivity type semiconductor substrate; forming a gate insulating film on the semiconductor substrate; depositing a first conductive film on the gate insulating film; patterning a photoresist so that the photoresist is at a prescribed location on the first conductive film where a gate electrode is to be formed; selectively etching a multi-layer film including the gate insulating film and the first conductive film with the photoresist being used as a mask by anisotropic etching having high anisotropy in the vertical direction until the gate insulating film is exposed; removing the photoresist; depositing a first insulating film on the substrate and the gate electrode; removing part of the first insulating film by anisotropic etching having high anisotropy in the vertical direction so that the remaining part thereof is on the side of the gate electrode; forming a first diffusion layer of second conductivity type in source/drain regions in the substrate by ion implantation; depositing a conductive film on the substrate and the gate electrode; silicidizing the gate electrode and the source/drain regions in the substrate; depositing a second insulating film on the substrate and the gate electrode; selectively removing part of the second insulating film by anisotropic etching having high anisotropy in the vertical direction and by dry etching having a sufficient selective ratio for the silicide layer so that the remaining part thereof is on the side of the gate electrode; and forming a second diffusion layer of second conductivity type in the source/drain regions in the substrate by ion implantation, the second diffusion layer having a PN-junction depth larger than that of the first diffusion layer.

According to still another aspect of the present invention, a method of producing a MOS semiconductor device includes the steps of forming a device isolation region on a main surface of a first conductivity type semiconductor substrate; forming a gate insulating film on the semiconductor substrate; depositing a first conductive film on the gate insulating film; patterning a photoresist so that the photoresist is at a prescribed location on the first conductive film where a gate electrode is to be formed; selectively etching a multi- layer film including the gate insulating film and the first conductive film with the photoresist being used as a mask by anisotropic etching having high anisotropy in the vertical direction until the gate insulating film is exposed; removing the photoresist; depositing a first insulating film on the substrate and the gate electrode; removing part of the first insulating film by anisotropic etching having high anisotropy in the vertical direction so that the remaining part thereof is on the side of the gate electrode; forming a first diffusion layer of second conductivity type in source/drain regions in the substrate by ion implantation; depositing a second insulating film on the substrate and the gate electrode; selectively removing part of the second insulating film by anisotropic etching having high anisotropy in the vertical direction so that the remaining part thereof is on the side of the gate electrode; forming a second diffusion layer of second conductivity type in the source/drain regions in the substrate by ion implantation, the second diffusion layer having a PN-Junction depth larger than that of the first diffusion layer; depositing a first conductive film on the substrate and the gate electrode; silicidizing the gate electrode and the source/drain regions in the substrate; removing the second insulating film; and selectively growing a second conductive film on the part of the substrate not silicidized.

According to still another aspect of the present invention, a method of producing a semiconductor device includes the steps of forming a device isolation region on a main surface of a first conductivity type semiconductor substrate; forming a gate insulating film on the semiconductor substrate; depositing a first conductive film on the gate insulating film; patterning a photoresist so that the photoresist is at a prescribed location on the first conductive film where a gate electrode is to be formed; selectively etching a multi-layer film including the gate insulating film and the first conductive film with the photoresist being used as a mask by anisotropic etching having high anisotropy in the vertical direction until the gate insulating film is exposed; removing the photoresist; depositing a first insulating film on the substrate and the gate electrode; removing part of the first insulating film by anisotropic etching having high anisotropy in the vertical direction so that the remaining part thereof is on the side of the gate electrode; forming a first diffusion layer of second conductivity type in source/drain regions in the substrate by ion implantation; selectively depositing a first conductive film on the substrate and the gate electrode; depositing a second insulating film on the substrate and the gate electrode; selectively removing part of the second insulating film by anisotropic etching having high anisotropy in the vertical direction and by dry etching having a sufficient selective ratio for the first conductive film so that the remaining part thereof is on the side of the gate electrode; forming a second diffusion layer of second conductivity type in the source/drain regions in the substrate by ion implantation, the second diffusion layer having a PN-junction depth larger than that of the first diffusion layer; and selectively depositing a second conductive film on the first conductive film on the substrate and the gate electrode.

These and other advantages of the present invention will become apparent to those skilled in the art upon reading and understanding the following detailed description with reference to the accompanying figures.

DESCRIPTION OF THE PREFERRED EMBODIMENTS

Hereinafter, a MOS semiconductor device and a production method thereof according to the present invention will be described with reference to figures.

(EXAMPLE 1)

Figure 1:
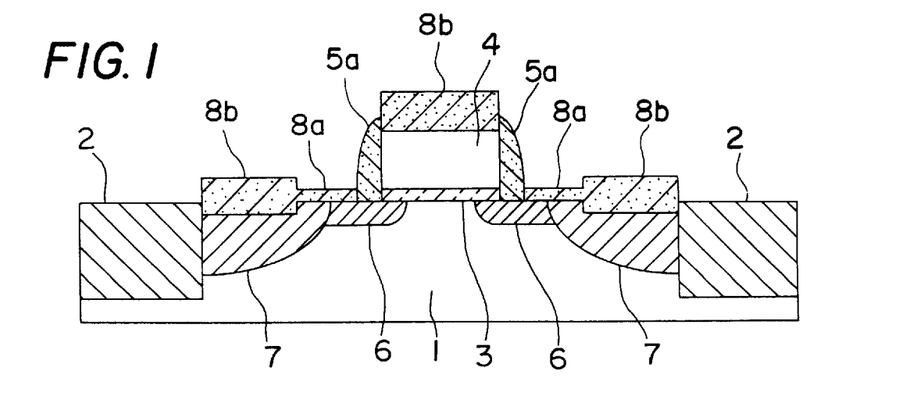
FIG. 1 is a cross-sectional view illustrating a MOS semiconductor device in accordance with one example of the present invention.

FIG. 1 illustrates a cross-section of a MOS semiconductor device in accordance with Example 1 of the present invention.

The MOS semiconductor device in FIG. 1 includes a P-type semiconductor substrate 1, a gate insulating film 3 formed on the P-type semiconductor substrate 1, a gate electrode 4 provided on the gate insulating film 3, $SiO_2$ side walls 5a formed on the side of the gate electrode 4, N-type source/drain diffusion layers 6 having a shallow PN-junction provided in source/drain regions of the P-type semiconductor substrate 1, N-type source/drain diffusion layers 7 having a deep PN-junction provided in the source/drain regions of the P-type semiconductor substrate 1, and silicide layers 8a and 8b formed on both the gate electrode 4 and in the source/drain regions.

Although FIG. 1 only illustrates a single N-channel MOS semiconductor device, a plurality of MOS semiconductor devices are actually formed on the single P-type semiconductor substrate 1. Each of these MOS semiconductor devices has a structure as illustrated in the figure and is mutually and electrically isolated by isolating trenches 2 formed in the P-type semiconductor substrate 1. An N-type well may be provided in the P-type semiconductor substrate 1 and the P-channel MOS semiconductor device may be formed on the N-type well. Instead of a silicon substrate, a silicon layer formed on a substrate having an insulating surface (a glass substrate or the like) may be used to form a MOS semiconductor device (thin film transistor).

The first feature of the MOS semiconductor device in FIG. 1 is that the silicide layers 8a are provided so as to cover at least part of the shallow source/drain diffusion layers 6. In the prior art, although the silicide layers were sometimes formed on the deep source/drain diffusion layers 7, the silicide layers were not formed on the shallow source/drain diffusion layers 6. In this example, since the silicide 8a cover at least part of the upper surfaces of the shallow source/drain diffusion layers 6, or preferably about a half of the area, the source/drain resistance is reduced as a whole. As a result, even in a case where the number of source/drain contacts assigned to each transistor is chosen to be one, the drain current hardly decreases.

The second feature is that the silicide layers are configured of two parts having different thicknesses. Relatively thin silicide layers 8a are provided on the source/drain diffusion layers 6 having a shallow PN-junction and relatively thick silicide layers 8b are provided on the source/drain diffusion layers 7 having a deep PN-junction. This ensures that the formation of the silicide layers does not have a negative influence on the PN-junctions formed between the source/drain diffusion layers 6 and 7 and the semiconductor substrate 1. If silicide layers having the same thickness as the relatively thick silicide layers 8b are provided on the source/drain diffusion layers 6 having a shallow PN-junction, then it is considered that the leakage current flowing through the PN-junction could increase. In order to avoid an increase in the leakage current, it is preferable to set a thickness of the silicide layers 8a (final thickness) to be provided on the source/drain diffusion layers 6 having a shallow PN-junction to be about 20 to about 50% of the PN-junction depth of the source/drain diffusion layers 6.

In order to examine the effect of the present invention, a CMOS process whose design rule is 0.13 μm is considered here. For example, consider the following design. The gate length is 0.13 μm and the gate oxidation thickness is 4 nm. In order to have both the inhibition of a short channel effect and large drain current, a PN-junction depth of the shallow source/drain diffusion layers is set at about 80 nm and an impurity concentration at the surfaces thereof is set at $1.0 \times 10^{20}$ cm$^{-3}$. Furthermore, a width of the side walls is set at about 30 nm. A PN-junction depth of the deep source/drain diffusion layers is set at about 120 nm and an impurity concentration at the surfaces thereof is set at $2.0 \times 10^{20}$ cm$^{-3}$. A thickness of Ti to be deposited for the silicidization is set at 30 nm for the thick portion and 20 nm for the thin portion. The reason why the Ti thickness is 20 nm for the thin portion is to inhibit leakage current and to prevent a large increase in the source/drain resistance. The final thickness of the silicide layers becomes 60 nm for the thick portion and 40 nm for the thin portion. A width of the silicide layers becomes 80 nm for the thick portion and 90 nm for the thin portion.

According to the above design, the sheet resistance of the source/drain diffusion layers is 3Ω/□ for the thick portion and 4Ω/□ for the thin portion. If the gate width is 2.6 μm, then the channel resistance of the transistor is about 1 Ωk.

In the prior art example, the resistance in the source/drain regions is about 98Ω, and if the layout shown in FIG. 8B is employed, the drain current decreases by about 10%. On the other hand, according to the present invention, the resistance in the source/drain regions is reduced to about 53Ω and, consequently, the drain current decreases by about 5%.

Although the present invention uses Ti as a conductive material to form the silicide layers, other refractory metals such as Co and Ni may be used. Furthermore, instead of the silicide layers, layers made of a refractory metal such as W may be used. Moreover, only the thin portions of the silicide layers may be replaced with layers which are selectively formed of a refractory metal such as W.

Although an N-channel MOS transistor was described in the above example, the conductivity type may be reversed.

(EXAMPLE 2)

Figure 2:
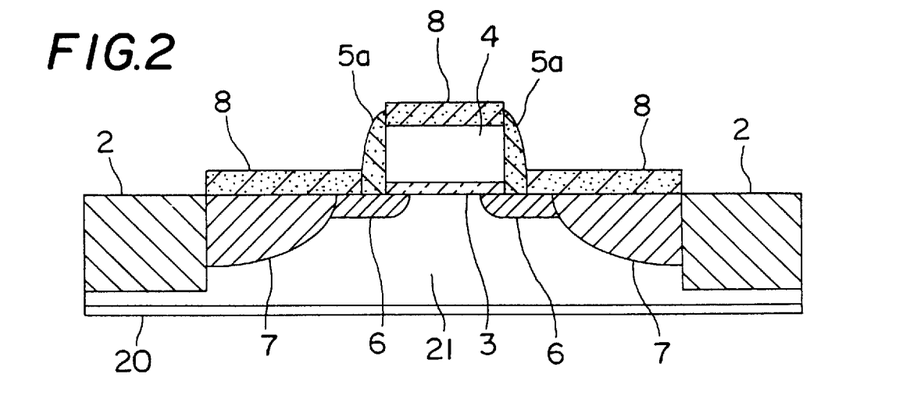
FIG. 2 is a cross-sectional view illustrating a MOS semiconductor device in accordance with another example of the present invention.

FIG. 2 illustrates a cross-section of a MOS semiconductor device in accordance with Example 2 of the present invention.

The MOS semiconductor device in FIG. 2 includes an insulating glass substrate 20, a P-type semiconductor, layer 21 a gate insulating film 3 formed on the P-type semiconductor layer 21, a gate electrode 4 provided on the gate insulating film 3, SiO$_2$ side walls 5a formed on the side of the gate electrode 4, N-type source/drain diffusion layers 6 having a shallow PN-junction provided in the source/drain regions of the P-type semiconductor layer 21, N-type source/drain diffusion layers 7 having a deep PN-junction provided in the source/drain regions of the P-type semiconductor layer 21, and silicide layers 8 formed both on the gate electrode 4 and in the source/drain regions.

Although FIG. 2 only illustrates a single MOS semiconductor device, a plurality of MOS semiconductor devices are actually formed on the single P-type semiconductor layer 21. Each of these MOS semiconductor devices has a structure illustrated in the figure and is mutually and electrically isolated by isolating trenches 2 formed in the P-type semiconductor layer 21.

A feature of the MOS semiconductor device in FIG. 2 is that the silicide layers 8 are provided so as to cover at least part of the shallow source/drain diffusion layers 6. In the prior art, although the silicide layers are sometimes formed on the deep source/drain diffusion layers 7, the silicide layers are not formed on the shallow source/drain diffusion layers 6.

In this example, since the silicide layers 8 having small resistance cover at least part of the shallow source/drain diffusion layers 6, the source/drain resistance is reduced. As a result, even in a case where the number of source/drain contacts assigned to each transistor is chosen to be one, the drain current hardly decreases. In order to avoid PN-junction leakage, it is preferable to make the thickness of the silicide layers 8 smaller than that of the silicide layers 8b in Example 1.

In order to examine the effect of the present invention, a CMOS process whose design rule is 0.13 μm is considered here. For example, consider the following design. The gate length is 0.13 μm and the gate oxidation thickness is 4 nm. In order to have both the inhibition of a short channel effect and large drain current, a PN-junction depth of the shallow source/drain diffusion layers is set at about 80 nm and an impurity concentration at the surfaces thereof is set at $1.0 \times 10^{20}$ cm$^{-3}$. Furthermore, a width of the side walls is set at about 30 nm. A PN-junction depth of the deep source/drain diffusion layers is set at about 120 nm and an impurity concentration at the surfaces thereof is set at $2.0 \times 10^{20}$ cm$^{-3}$. A thickness of Ti to be deposited for the silicidization is set at 20 nm. The reason why the Ti thickness is relatively small is to inhibit leakage current. The final thickness of the silicide layers becomes 40 nm. A width of the silicide layers is set at 170 nm.

According to the above design, the sheet resistance of the source/drain diffusion layers is calculated to be 4 106 /□. If the gate width is 2.6 μm, then the channel resistance of the transistor is about 1 Ωk. According to the prior art example, the resistance in the source/drain regions becomes about 98Ω, and if the layout shown in FIG. 8B is employed, the drain current decreases by as much as about 10%. On the other hand, according to the present invention, the resistance in the source/drain regions is reduced to about 53Ω and, consequently, the drain current decreases by about 6%.

Although the present invention uses Ti as a material to form the silicide layers, other refractory metals such as Co and Ni may be used. Furthermore, instead of the silicide layers, layers made of a refractory metal such as W may be used. Moreover, only the thin portion of the silicide layers may be replaced with layers which are selectively formed of a refractory metal such as W.

(EXAMPLE 3)

A first example of a production method of the MOS semiconductor device shown in FIG. 1 will be described with reference to FIGS. 3A to 3E.

Figure 3A:
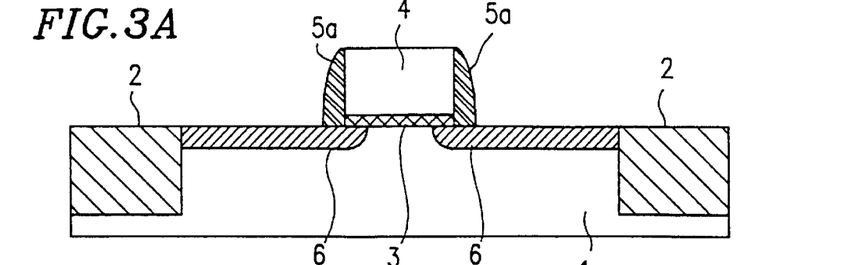
FIGS. 3A to 3E are cross-sectional views illustrating one example of a production method of a MOS semiconductor device in accordance with the present invention.

First, as shown in FIG. 3A, shallow isolating trenches 2 having a depth of about 600 nm are formed in device isolation regions of a P-type semiconductor substrate 1. Next, a gate insulating film 3 having a thickness of about 4 nm is formed on the P-type semiconductor substrate 1, and an undoped polycrystalline silicon film is deposited on the gate insulating film 3 to a thickness of about 200 nm. Next, a photoresist mask which defines the shape and location of the gate electrode 4 is formed on the polycrystalline silicon film using a photolithography technique. Then, by an etching (anisotropic etching) having high anisotropy in the vertical direction, portions of the polycrystalline silicon film which are not covered with the photoresist mask are selectively removed to form the gate electrode 4 made of the polycrystalline silicon. The photoresist mask is subsequently removed. After an HTO film is deposited so as to cover the gate electrode 4 to a thickness of about 30 nm, the flat portions of the HTO film are selectively removed by an anisotropic etching to form relatively thin $SiO_2$ side walls 5a from the HTO film. Next, N-type impurity ions (As ion, for example) are implanted into the P-type semiconductor substrate 1 with a dose of about $4\times10^{14}$ $cm^{-2}$ and acceleration energy of 10 keV, thereby forming N-type diffusion layers 6 having a shallow PN-junction within the source/drain regions. The formation of the N-type diffusion layers 6 having a shallow PN-junction may be performed before the formation of the $SiO_2$ side walls 5a.

Figure 3B:
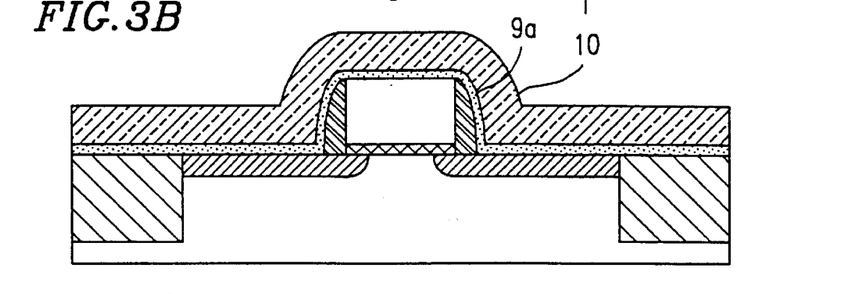

Next, as shown in FIG. 3B, a first Ti/TiN film 9a of a thickness of about 20 nm and a nitride film 10 of a thickness of about 70 nm are successively deposited. The Ti/TiN film here is a multi-layer film including a Ti layer as the lower layer and a TiN layer as the upper layer.

Figure 3C:
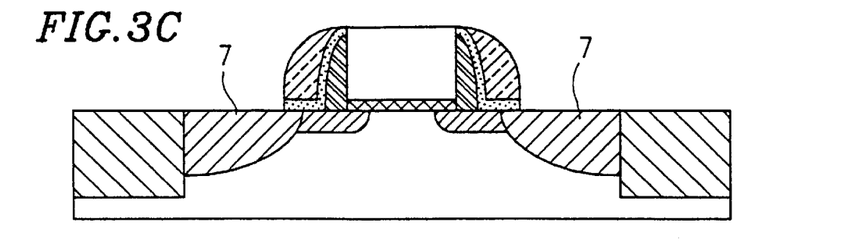

Next, as shown in FIG. 3C, the flat portions of the nitride film 10 and the first Ti/TiN layer 9a are removed by an anisotropic etching to form side walls of the nitride film 10. When forming these side walls, the Ti forming the lower layer of the first Ti/TiN layer 9a does not have to be removed completely. The portions of the first Ti/TiN layer 9a which are covered with the side walls of the nitride film 10 are not removed but remain. Then, N-type impurity ions (As ions, for example) are implanted into the P-type semiconductor substrate 1 with a dose of about $6\times10^{15}$ $cm_{-2}$ and acceleration energy of 60 keV, thereby forming N-type diffusion layers 7 having a deep PN-junction in the source/drain regions. During this ion implantation, the N-type impurity ions are also implanted into the gate electrode 4 so that the gate electrode 4 becomes highly conductive.

Figure 3D:
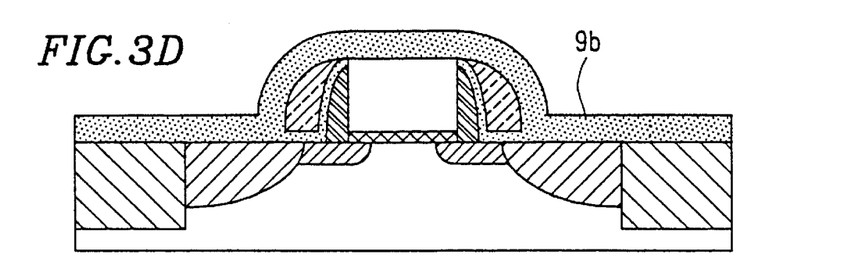
Figure 3E:
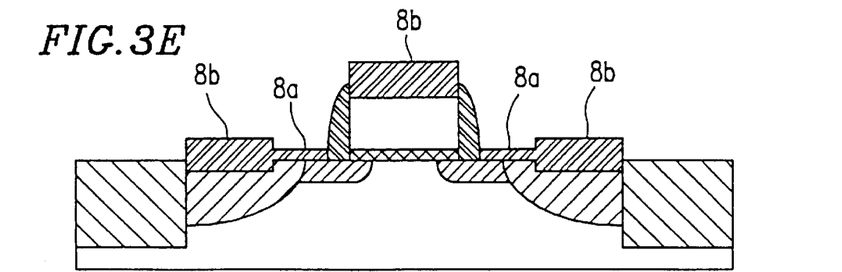

Next, as shown in FIG. 3D, a second Ti/TiN layer 9b is deposited to a thickness of about 30 nm. Then, a first RTA (Rapid Thermal Anneal) is performed at 700° C. for 30 sec followed by a second RTA at 1000° C. for 10 sec. As a result of this two-step annealing, the impurity ions implanted into the source/drain regions and the gate electrode 4 are activated and, at the same time, a silicidization takes place. This silicidization takes place at location where the first Ti/TiN layer 9a and the second Ti/TiN layer 9b make contact with the silicon. Next, after removing the portions of the second Ti/TiN layer 9b which are not silicidized by fluoric acid, the side walls of the nitride film 10 are removed by hot phosphoric acid or by isotropic dry etching. The portions of the first Ti/TiN layer 9a which are not silicidized are further removed thereafter by fluoric acid. Finally, a salicide structure including the silicide layers 8a and 8b is thereby formed as illustrated in FIG. 3E.

According to the present invention, the two kinds of silicide layers having different thicknesses can be self-aligningly formed without additionally using any specially designed mask. Furthermore, since a thickness of the first Ti/TiN layer 9a and a thickness of the second Ti/TiN layer 9b can independently be set, the degree of freedom in design is enhanced.

Although the present invention uses Ti as a conductive material to form the silicide layers, other refractory metals such as Co and Ni may be used.

(EXAMPLE 4)

A second example of a production method of the MOS semiconductor device shown in FIG. 2 will be described with reference to FIGS. 4A to 4D.

Figure 4A:
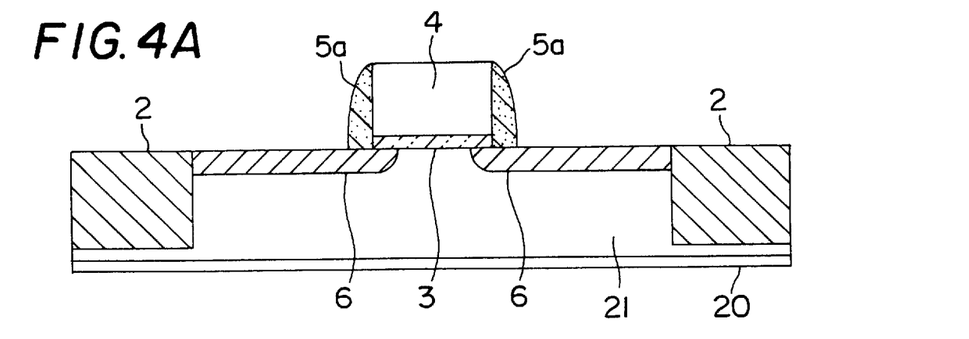
FIGS. 4A to 4D are cross-sectional views illustrating another example of a production method of a MOS semiconductor device in accordance with the present invention.

First, a P-type semiconductor layer 21 is formed on a glass insulating substrate 20. Then, as shown in FIG. 4A, shallow isolating trenches 2 having a depth of about 600 nm are formed in device isolation regions of the P-type semiconductor layer 21. Next, a gate insulating film 3 having a thickness of about 4 nm is formed on the P-type semiconductor layer 21, and an undoped polycrystalline silicon film is deposited on the gate insulating film 3 to a thickness of about 200 nm. Next, a photoresist mask which defines the shape and location of the gate electrode 4 is formed on the polycrystalline silicon film using a photolithography technique. Then, by an etching (anisotropic etching) having high anisotropy in the vertical direction, portions of the polycrystalline silicon film 4 which are not covered with the photoresist mask are selectively removed to form the gate electrode 4 made of the polycrystalline silicon. The photoresist mask is subsequently removed. After an HTO film is deposited so as to cover the gate electrode 4 to a thickness of about 30 nm, the flat portions of the HTO film are selectively removed by an anisotropic etching to form relatively thin $SiO_2$ side walls 5a from the HTO film. Next, N-type impurity ions (As ion, for example) are implanted into the P-type semiconductor layer 21 with a dose of about $4\times10^{14}$ $cm^{-2}$ and acceleration energy of 10 keV, thereby forming N-type diffusion layers 6 having a shallow PN-junction within the source/drain regions.

Figure 4B:
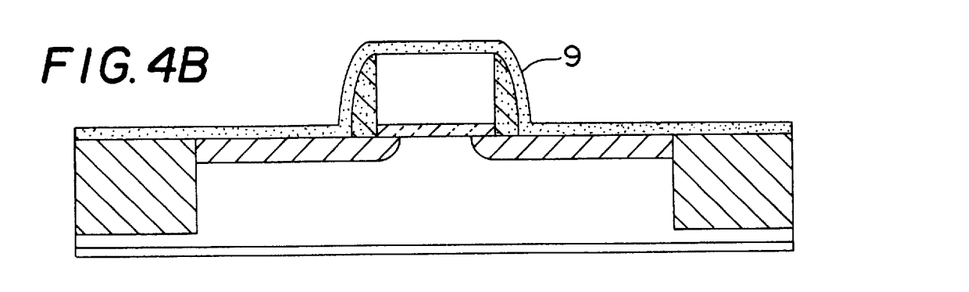

Next, as shown in FIG. 4B, a Ti/TiN film 9 of a thickness of about 20 nm is deposited.

Figure 4C:
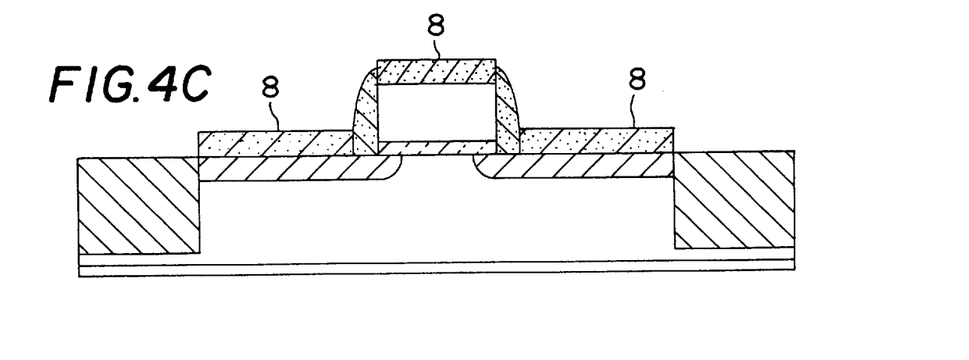

Next, as shown in FIG. 4C, a first RTA (Rapid Thermal Anneal) is performed at 700° C. for 30 sec. As a result of this anneal, the impurity ions implanted into the source/drain regions and the gate electrode 4 are activated and, at the same time, a silicidization takes place. This silicidization takes place at locations where the Ti/TiN layer 9 makes contact with the silicon. Next, after removing the portions of the Ti/TiN layer 9 which are not silicidized by fluoric acid, an HTO film is deposited so as to cover the gate electrode 4 to a thickness of about 90 nm. Then, the flat portions of the HTO film are selectively removed by an anisotropic etching to form relatively thick $SiO_2$ side walls 5b from the HTO film.

Figure 4D:
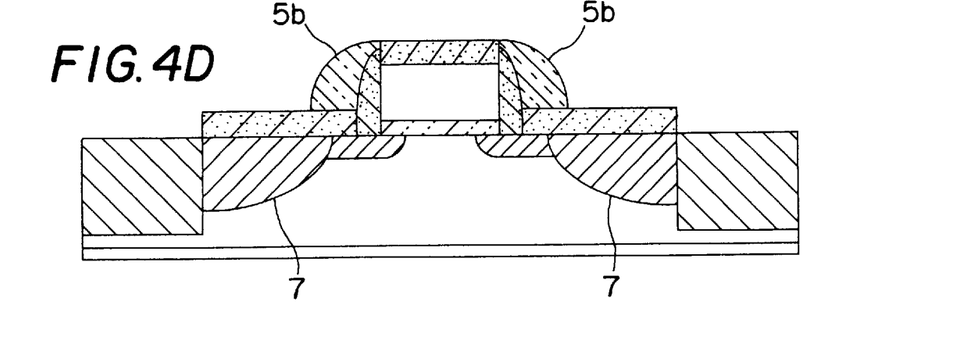

Next, N-type impurity ions (As ions, for example) are implanted into the P-type semiconductor layer 21 with a dose of about $6 \times 10^{15}$ cm$^{-2}$ and acceleration energy of 60 keV, thereby forming N-type diffusion layers 7 having a deep PN-junction in the source/drain regions. At the same time, the gate electrode 4 is doped with As ions, to form the N-type polysilicon gate electrode 4. Finally, a second RTA is performed at 1000° C. for 10 sec, which completes the activation of the impurity ions implanted into the source/drain regions and the gate electrode 4.

According to the present invention, the two kinds of silicide layers having different thicknesses can be self-aligningly formed without additionally using any specially designed mask.

Although the present invention uses Ti as a conductive material to form the silicide layers, other refractory metals such as Co and Ni may be used.

(EXAMPLE 5)

An example of a production method of a device similar to the MOS semiconductor device in FIG. 1 will be described with reference to FIGS. 5A to 5D.

Figure 5A:
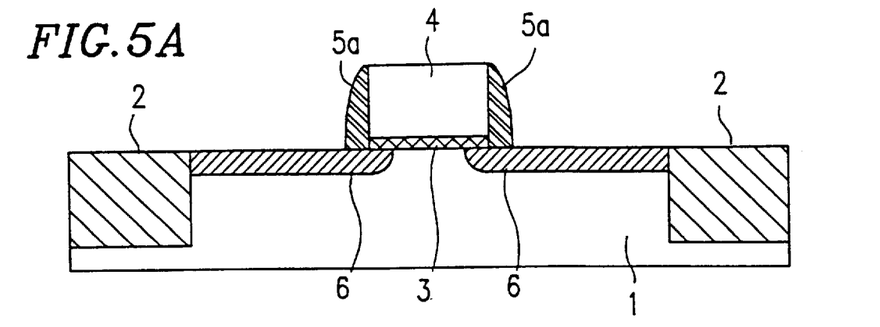
FIGS. 5A to 5D are cross-sectional views illustrating still another example of a production method of a MOS semiconductor device in accordance with the present invention.

First, as shown in FIG. 5A, shallow isolating trenches 2 having a depth of about 600 nm are formed in device isolation regions of a P-type semiconductor substrate 1. Next, a gate insulating film 3 having a thickness of about 4 nm is formed on the P-type semiconductor substrate 1, and an undoped polycrystalline silicon film is deposited on the gate insulating film 3 to a thickness of about 200 nm. Next, a photoresist mask which defines the shape and location of the gate electrode 4 is formed on the polycrystalline silicon film using a photolithography technique. Then, by an etching (anisotropic etching) having high anisotropy in the vertical direction, portions of the polycrystalline silicon film 4 which are not covered with the photoresist mask are selectively removed to form the gate electrode 4 made of the polycrystalline silicon. The photoresist mask is subsequently removed. After an HTO film is deposited so as to cover the gate electrode 4 to a thickness of about 30 nm, the flat portions of the HTO film are selectively removed by an anisotropic etching to form relatively thin $SiO_2$ side walls 5a from the HTO film. Next, N-type impurity ions (As ion, for example) are implanted into the P-type semiconductor substrate 1 with a dose of about $4 \times 10^{14}$ cm$^{-2}$ and acceleration energy of 10 keV, thereby forming N-type diffusion layers 6 having a shallow PN-junction within the source/drain regions.

Figure 5B:
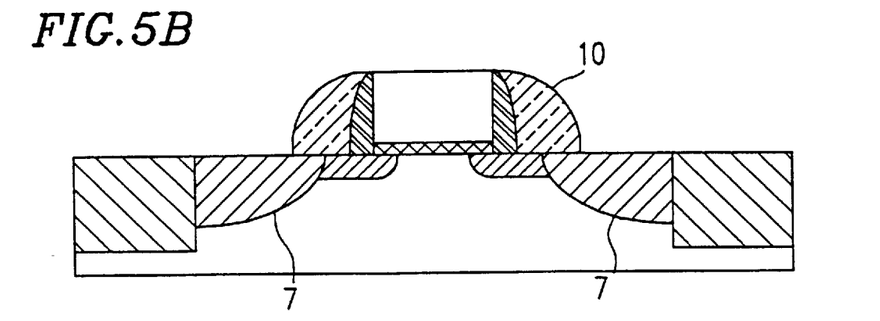

Next, after depositing a nitride film so as to cover the gate electrode 4 to a thickness of about 90 nm, the flat portions of the nitride film are selectively removed by an anisotropic etching to form relatively thick side walls made of the nitride film 10. Then, N-type impurity ions (As ions, for example) are implanted into the P-type semiconductor substrate 1 with a dose of about $6 \times 10^{15}$ cm$^{-2}$ and acceleration energy of 60 keV, thereby forming N-type diffusion layers 7 having a deep PN-junction in the source/drain regions. The gate electrode is doped with As ions at the same time to form the N-type polysilicon gate electrode 4.

A first RTA (Rapid Thermal Anneal) is performed at 1000° C. for 10 sec. As a result of this anneal, the impurity ions implanted in the source/drain regions and the gate electrode 4 are activated and, at the same time, a silicidization also takes place. This silicidization takes place at locations where the portions of the Ti/TiN layer 9 make contact with the silicon.

Figure 5C:
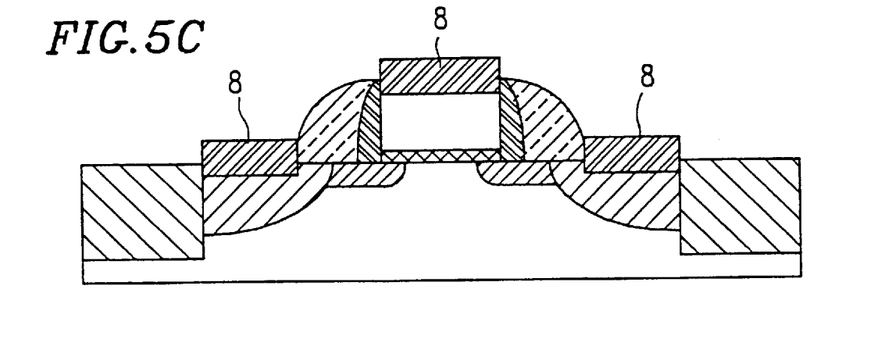

Next, after depositing the Ti/TiN layer 9 to a thickness of about 20 nm, a second RTA is performed at 700° C. so that the gate and the source/drain are silicidized. The portions of the Ti/TiN layer 9 which are not silicidized are etched away by fluoric acid, thereby forming silicide layers 8.

Figure 5D:
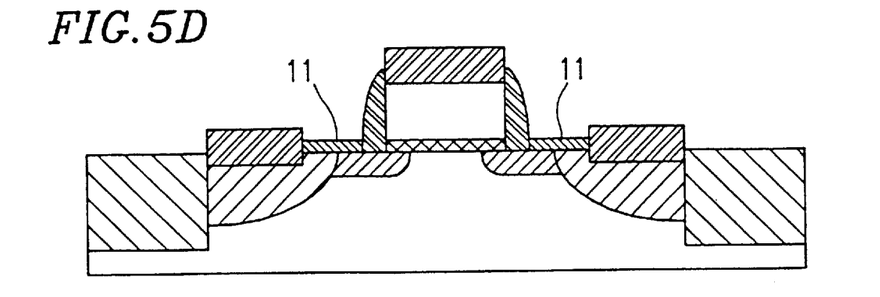

Then, after etching the side walls of the nitride film 10 by hot phosphoric acid or by isotropic dry etching, W layers are selectively formed to a thickness of about 20 nm on the portions of the P-type substrate which are not covered with the silicide, i.e., on the portions where the side walls of the nitride film 10 were. The W layer is formed by CVD using $WF_6/SiH_4$ gas.

The device produced thereby has almost the same effect as the semiconductor device shown in FIG. 1. Furthermore, according to this example, since the silicidization is performed after the activation of the impurity ions implanted into the source/drain regions and the gate electrode, conditions for the silicidization can be selected from a wide range of conditions.

(EXAMPLE 6)

An example of a production method of a device similar to the MOS semiconductor device in FIG. 1 will be described with reference to FIGS. 6A to 6D.

Figure 6A:
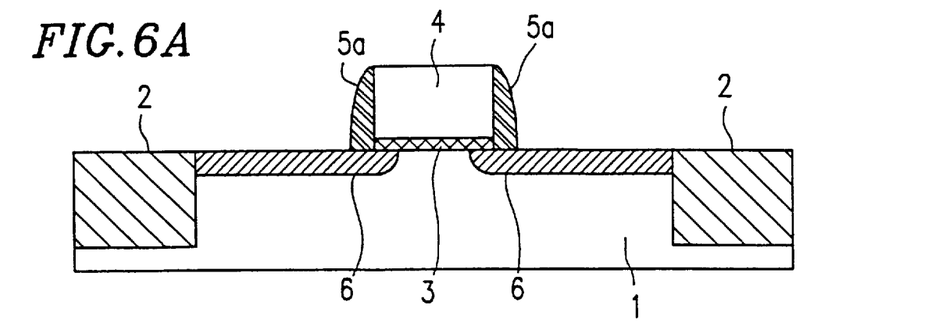
FIGS. 6A to 6D are cross-sectional views illustrating still another example of a production method of a MOS semiconductor device in accordance with the present invention.

First, as shown in FIG. 6A, shallow isolating trenches 2 having a depth of about 600 nm are formed in device isolation regions of a P-type semiconductor substrate 1. Next, a gate insulating film 3 having a thickness of about 4 nm is formed on the P-type semiconductor substrate 1, and an undoped polycrystalline silicon film is deposited on the gate insulating film 3 to a thickness of about 200 nm. Next, a photoresist mask which defines the shape and location of the gate electrode 4 is formed on the polycrystalline silicon film using a photolithography technique. Then, by an etching (anisotropic etching) having high anisotropy in the vertical direction, portions of the polycrystalline silicon film which are not covered with the photoresist mask are selectively removed to form the gate electrode 4 made of the polycrystalline silicon. The photoresist mask is subsequently removed. After an HTO film is deposited so as to cover the gate electrode 4 to a thickness of about 30 nm, the flat portions of the HTO film are selectively removed by an anisotropic etching to form relatively thin $SiO_2$ side walls 5a from the HTO film. Next, N-type impurity ions (As ion, for example) are implanted into the P-type semiconductor substrate 1 with a dose of about $4 \times 10^{14}$ cm$^{-2}$ and acceleration energy of 10 keV, thereby forming N-type diffusion layers 6 having a shallow PN-junction within the source/drain regions.

Figure 6B:
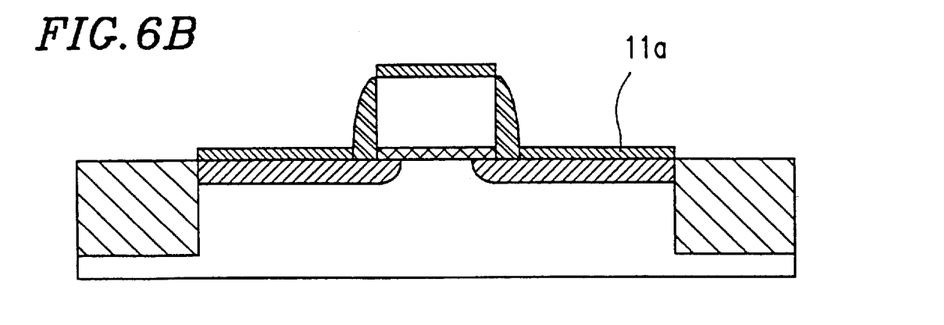

Next, as shown in FIG. 6B, first selective W layers 11a are selectively grown both on the source/drain regions and the gate electrode 4 to a thickness of about 20 nm. This W layer is formed by CVD using $WF_6/SiH_4$ gas.

Figure 6C:
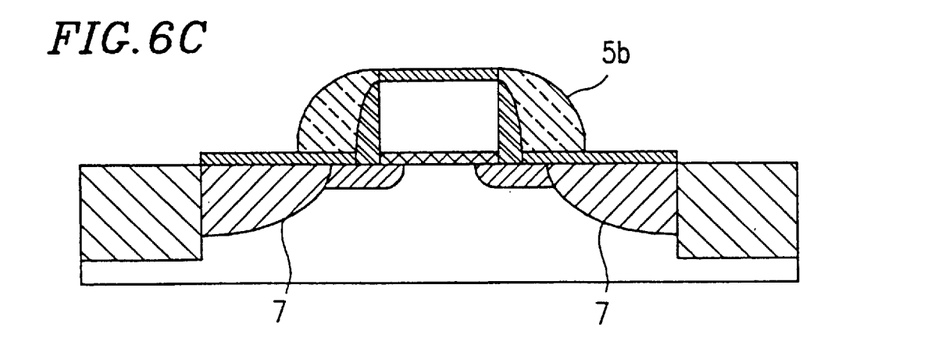

Next, as shown in FIG. 6C, after depositing an HTO film to a thickness of about 90 nm, thick $SiO_2$ side walls 5b are formed by an anisotropic etching. Then, N-type impurity ions (As ions, for example) are implanted into the P-type semiconductor substrate 1 with a dose of about $6\times10^{15}$ cm$^{-2}$ and acceleration energy of 60 keV, thereby forming N-type diffusion layers 7 having a deep PN-junction in the source/drain regions. At the same time, the gate electrode is doped with As ions to form the N-type polysilicon gate electrode 4.

Furthermore, an RTA is performed at 1000° C. for 10 sec to simultaneously activate the impurity ions implanted into the source/drain regions and the gate electrode 4.

Figure 6D:
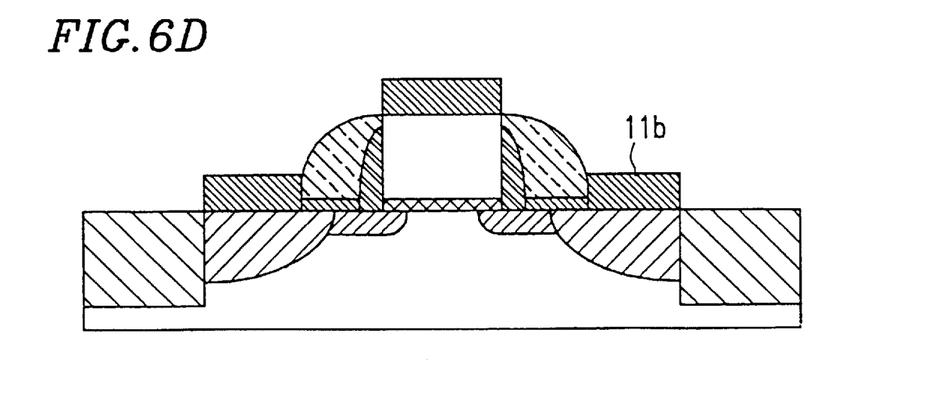

Next, as illustrated in FIG. 6D, second selective W layers 11b are grown to a thickness of about 20 nm on the portions of the first selective W layers exposed on the source/drain regions and the gate electrode.

The shallow source/drain diffusion layers of the device produced thereby have a thickness of 80 nm and an impurity concentration at the surface of $1.0\times10^{20}$ cm$^{-3}$. The deep source/drain diffusion layers have a PN-junction depth of 120 nm and an impurity concentration at the surface of $2.0\times10^{20}$ cm$^{-3}$. The W layers have thicknesses of 40 nm for the thick portion and 20 nm for the thin portion. The width of the W layers at the thin portion is 90 nm.

The sheet resistance of the source/drain diffusion layers is $2\Omega/\square$ for the thick portion and $4\Omega/\square$ for the thin portion. If a width of narrow source/drain regions is assumed to be 0.2 $\mu$m, then the width of the W layers at the thick portion becomes 80 nm. If the gate length is 0.13 $\mu$m and the gate width is 2.6 $\mu$m, then the channel resistance of the transistor is about 1 k$\Omega$. In the prior art example, the resistance of the source/drain regions is about 98 $\Omega$, and if the layout shown in FIG. 8B is employed, the drain current decreases by as much as about 10%. On the other hand, the resistance of the source/drain regions according to the present invention can be reduced to about 42$\Omega$ and, consequently, the deterioration of the drain current is kept to about 4%.

This example has an advantage that, since silicide layers are not used, a thickness of the selective W layers can be set independently of the PN-junction depth of the source/drain diffusion layers. This makes it possible to control a thickness of the first selective W layers to such an extent that the capacitance between the gate and drain does not increase very much and also makes it possible to increase a thickness of the second selective W layers to such an extent that the source/drain resistance is sufficiently reduced.

Moreover, in this example, it is possible to easily and self-aligningly produce a semiconductor device using conventional LSI technology, which does not have a deterioration of drain current which would occur in a case where the number of contacts of source/drain is one and the width of the source/drain is made small in a region of deep submicron or less.

According to a semiconductor device of the present invention, silicide layers or metal layers are provided to part of the shallow source/drain diffusion layers and the deep source/drain diffusion layers, which were not so provided in the prior art. Therefore, source/drain resistance can be reduced, and a deterioration of drain current which would occur when the number of contacts of the source/drain is one can be prevented.

According to a production method of a semiconductor of the present invention, it is possible to easily and self-aligningly produce a semiconductor device using conventional LSI technology, which does not have a deterioration of drain current which would occur in a case where the number of contacts of source/drain is one and the width of the source/drain is made small in a region of deep submicron or less.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A MOS semiconductor device, comprising:
    a first conductivity type silicon layer having a main surface;
    a gate insulating film selectively formed on said main surface of said silicon layer;
    a gate electrode provided on the gate insulating film;
    an insulating side wall formed on the side of said gate electrode; and
    source/drain regions formed in said silicon layer;
    wherein said source/drain regions comprise:
        a first diffusion layer of second conductivity type formed in said silicon layer; and
        a second diffusion layer of second conductivity type formed in said silicon layer on the outside of said first diffusion layer and having a PN-junction depth larger than that of said first diffusion layer;
        wherein said MOS semiconductor device further comprises a conductive layer covering at least part of said first diffusion layer and at least part of said second diffusion layer;
        wherein said conductive layer comprises a first part having a first thickness and a second part having a second thickness larger than said first thickness; and
        said first part of said conductive layer covers said at least part of said second diffusion layer.

2. A MOS semiconductor device according to claim 1, wherein said silicon layer is formed on a substrate having an insulating surface.

3. A MOS semiconductor device according to claim 1, wherein said conductive layer is formed of silicide.

4. A MOS semiconductor device according to claim 1, wherein said gate electrode has a multi-layer structure comprising a lower silicon film and an upper silicide film.

5. A MOS semiconductor device according to claim 1, wherein said silicon layer is formed of a single crystalline semiconductor.

* * * * *

UNITED STATES PATENT AND TRADE MARK OFFICE
CERTIFICATE OF CORRECTION

PATENT NO.   : 5,841,173
DATED        : November 24, 1998
INVENTOR(S)  : Yamashita It is certified that error appears in the above-identified patent and that said Letters Patent is hereby corrected as shown below:

Cover page, item [56] References Cited, insert:

FOREIGN PATENT DOCUMENTS 6-291141   10/1994  Japan
62-154755  7/1987   Japan
1-291464   11/1989  Japan
59-172775  9/1984   Japan Signed and Sealed this Fifteenth Day of June, 1999

*Attest:*

Q. TODD DICKINSON

*Attesting Officer*          *Acting Commissioner of Patents and Trademarks*